(12) United States Patent
Rogers

(10) Patent No.: US 8,765,234 B2
(45) Date of Patent: Jul. 1, 2014

(54) ELECTRON BEAM PLASMA CHAMBER

(75) Inventor: Matthew S. Rogers, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 101 days.

(21) Appl. No.: 13/449,189

(22) Filed: Apr. 17, 2012

(65) Prior Publication Data

US 2013/0029061 A1   Jan. 31, 2013

Related U.S. Application Data

(60) Provisional application No. 61/513,498, filed on Jul. 29, 2011.

(51) Int. Cl.
*C23C 8/00*   (2006.01)
*H05H 1/24*   (2006.01)

(52) U.S. Cl.
USPC ........................................... 427/585; 427/569

(58) Field of Classification Search
USPC .................................................. 427/585, 569
See application file for complete search history.

(56) References Cited

U.S. PATENT DOCUMENTS

| | | | |
|---|---|---|---|
| 4,509,451 A | 4/1985 | Collins et al. | |
| 5,534,314 A | 7/1996 | Wadley et al. | |
| 6,582,777 B1 | 6/2003 | Ross et al. | |
| 6,921,722 B2 * | 7/2005 | Ogure et al. | 438/708 |
| 7,060,330 B2 | 6/2006 | Zheng et al. | |
| 7,262,555 B2 * | 8/2007 | Rueger et al. | 315/111.21 |
| 7,998,307 B2 | 8/2011 | Chen et al. | |
| 8,026,501 B2 * | 9/2011 | Williamson et al. | 250/559.4 |
| 2005/0227020 A1 * | 10/2005 | Sharafutdinov et al. | 427/596 |

* cited by examiner

*Primary Examiner* — Kelly M Gambetta
(74) *Attorney, Agent, or Firm* — Patterson & Sheridan, LLP

(57) ABSTRACT

A method and apparatus for tailoring the formation of active species using one or more electron beams to improve gap-fill during an integrated circuit formation process is disclosed herein. The energy of the electron beams may be decreased to maximize electrons leading to radicals or increased to maximize electrons leading to ions, depending on the fill application. An apparatus comprising multiple impinging jets of gas perpendicular to one or more electron beams is also disclosed.

9 Claims, 7 Drawing Sheets

ELECTRON BEAM PLASMA CHAMBER

CROSS-REFERENCE TO RELATED APPLICATIONS

This application claims benefit of U.S. Provisional Patent Application Ser. No. 61/513,498, filed Jul. 29, 2011, which is herein incorporated by reference.

BACKGROUND OF THE INVENTION

1. Field of the Invention

Embodiments of the present invention generally relate to a process and processing chamber that are useful for improving gap-fill during an integrated circuit processing sequence.

2. Description of the Related Art

As semiconductor device geometries continue to decrease in size, providing more devices per unit area on a fabricated substrate has become increasingly important. These devices are initially isolated from each other as they are formed on the substrate, and they are subsequently interconnected to create the specific circuit configurations desired. For example, spacing between devices such as conductive lines or traces on a patterned substrate may be separated by 0.18 μm, leaving recesses or gaps of a comparable size.

Dielectric layers are used in various applications including shallow trench isolation (STI) dielectric for isolating devices and interlayer dielectric (ILD) formed between metal wiring layers or prior to a metallization process. In some cases, STI is used for isolating devices having feature dimensions as small as under about 0.5 μm. For example, a nonconductive layer of dielectric material, such as silicon dioxide ($SiO_2$), is typically deposited over the features to fill the aforementioned gaps (gap-fill) and insulate the features from other features of the integrated circuit in adjacent layers or from adjacent features in the same layer.

In some of these cases, the aspect ratio of the depth to width of the trench to be filled exceeds 6:1. Careful control of ion and radical density is necessary for high aspect ratio features as well as for advanced active species energy specification for selective applications (for example, selective nitridation of Si vs. $SiO_2$). During deposition, charged species tend to result in a directional flux hence resulting in bottom-up fill, while uncharged species such as radicals tend to contribute more to the deposition on the sidewall. Therefore, careful control of the ratio of ions and radicals is important. Too many radicals may grow on the sidewall and top corner of the trench and result in pinch-off of the feature. Because some sources result in better side deposition and others result in better bottom deposition, conformality has typically been achieved by using one tool for bottom fill and another tool for side fill. Minimizing the flux of radicals will allow much higher aspect ratios to be filled. Maximizing the flux of radicals will augment deposition on the sidewalls of an aspect feature. Therefore, there is need for a method of tuning and/or controlling a substrate deposition process to adequately fill features of a desired size within the one processing tool.

Ion and radical generation in all current plasma growth and deposition technologies (e.g., inductively coupled, capacitively coupled, and microwave generated plasmas) are coupled or linked because both species are created by their interaction with ions and electrons that are generated in a plasma formed in a processing region of a processing chamber. Due to the inherent broad energy distribution found in these conventional ion and radical formation techniques, the formed species have widely differing amounts of energy and a relatively fixed or skewed ratio of formed radicals to formed ions. As illustrated in FIG. 2, a typical energy distribution of an electron generated in a plasma includes a high energy initial peak at low energies (e.g., ~2 eV) and an exponential decay in the number of electrons that have higher energies. Typically, only small changes in the ratio of ion to radical species can be made by adjusting process conditions such as pressure and gas composition. Additionally, delivery of the different types of active species can only be tuned by making major hardware changes in the processing chamber such as adding an ion filter, a remote plasma, or changing the showerhead. However, true separation of ion and radical species can generally not be accomplished using these conventional plasma processing methods. Therefore, there is a need for an apparatus and method of better controlling the radical to ion ratio without having to alter process conditions (such as pressure and gas composition) or chamber configuration during processing.

SUMMARY OF THE INVENTION

The present invention generally relates to an apparatus and a method for tailoring the formation of active species in a processing apparatus by use of one or more electron beams to improve gap-fill during a deposition process used to form integrated circuit devices.

Embodiments of the present invention generally include methods of tailoring the energy of one or more electron beams to maximize the formation of a desired species (electrons leading to ions or electrons leading to radicals) that aid in improving the deposition process and deposited film properties. In one embodiment, electrons leading to ions are maximized for high aspect fill by applying a high electron beam energy above the ionization threshold of the source gas. In another embodiment, electrons leading to radicals are maximized for depositing an oxide having good electrical quality by applying a low electron beam energy below the ionization threshold and above the dissociation threshold of the source gas, increasing the temperature of the substrate and not using a bias.

In another embodiment described herein, an electron beam chamber is described wherein the one or more electron beams are directed as a sheet (as opposed to a beam) perpendicular to a gas stream flowing towards a substrate. Multiple impinging jets created by these electron sheet/gas stream configurations may scan across a large area of a moving substrate in order to increase throughput. The substrate may translate or rotate under the impinging jets. The distance from the electron beams to the substrate and the temperature of the substrate may be controlled in order to achieve better conformality.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
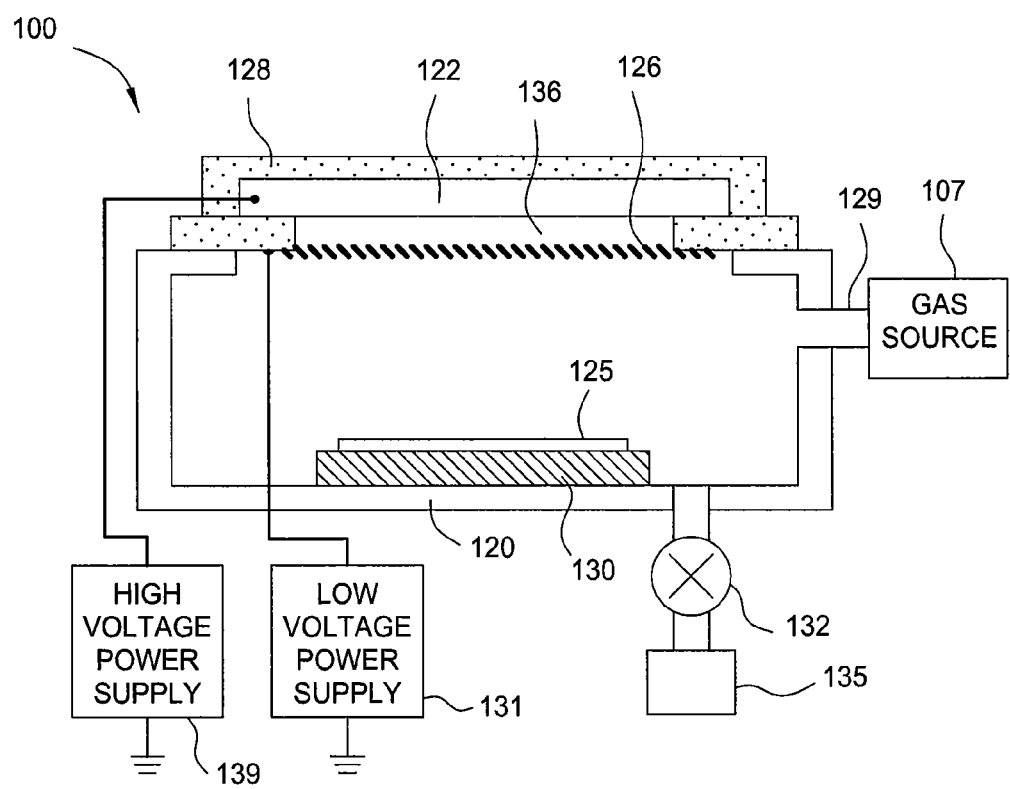
FIG. 1 shows a schematic cross sectional view of a prior art embodiment of an electron beam chamber configuration.

Embodiments disclosed herein generally relate to a method and apparatus for tailoring the formation of active species using one or more electron beams to improve gap-fill during an integrated circuit formation process. The methods described herein allow the amount of each type of active species to be controlled independently of the other typical process variables, such as process pressure, gas composition. The method described herein tailors the energy of the electron beams to maximize the desired species (e.g., ions or radicals). In one embodiment, the percentage of ions in the processing region of a processing chamber is maximized for high aspect fill by delivering a high electron beam energy to a portion of the processing chamber gas. In another embodiment, the percentage of radicals in the processing region of a processing chamber is maximized by delivering a desirable electron beam energy. In this case, an oxide having good electrical quality can be formed by increasing the temperature of the substrate, and not by biasing the substrate.

In another embodiment (see FIG. 6), an electron beam processing chamber includes one or more electron beams that are formed as a sheet (as opposed to a cylindrical beam) that is aligned perpendicular to a gas stream that is directed towards a surface of a substrate. In this case, the energy delivered in the electron beams is formed in the shape of a sheet, such that the cross-section of the beam is wider in one direction versus another direction normal to the width direction. In one embodiment, multiple impinging jets of gas of varying or constant gas composition are delivered through the formed electron beams to the surface of the substrate. In some configurations, the multiple impinging jets of gas may be scanned across at least a portion of a moving substrate in order to increase throughput and improve substrate deposition process results. The substrate may translate or rotate under the impinging jets.

The distance from the electron beams to the substrate and the temperature of the substrate may be controlled in order to achieve better conformality. In conventional devices having a fixed distance between the source and the substrate, the composition of an excited gas that flows towards the substrate changes as a function of time due to collisions between gas atoms (mean free path (pressure dependent) and with the walls of the chamber. An advantage of the chamber configuration described herein is that there are no chamber parts (e.g., a showerhead) between the electron beams and the substrate. Therefore, the spacing between the electron beams and the substrate can be varied in order to account for the decaying gas and control the type of species at the surface of the substrate.

In another embodiment, the method of controlling an active species of one or more electron beams can include positioning a substrate in a processing chamber, flowing the one or more source gases into the processing chamber, wherein the source gas has an ionization threshold energy level and a dissociation threshold energy level, impinging the source gases with one or more electron beams at a first energy level, which is above the ionization threshold energy level of the source gas, to deposit a first layer of a desired thickness primarily on horizontal surfaces of the substrate, maintaining the flow of the one or more source gases into the processing chamber, and impinging the source gases with one or more electron beams at a second energy level, which is below the ionization threshold energy level and above the dissociation threshold energy level of the source gases, to deposit a second layer of a desired thickness primarily on the side walls of the substrate.

The one or more electron beams can impinge the source gases at an angle between 75° and 105°, with preferable embodiments at an angle that is perpendicular to the flow of the gas. As well, each source gas can be impinged separately by one or more electron beams.

In another embodiment, the method of controlling an active species of one or more electron beams, can include positioning a substrate in a processing chamber, flowing one or more source gases into the processing chamber, wherein the source gases have an ionization peak and a dissociation peak, and impinging the one or more source gases with one or more electron beams at a third energy level, which is an energy level between the ionization peak and the dissociation peak, which can deposit a layer on both the side walls and the horizontal surfaces. The layer can be a conformal layer.

In one embodiment, an apparatus for depositing a film can include a processing chamber defined by walls, a vacuum pump coupled to the processing chamber, a substrate support positioned within the processing chamber to receive a substrate, a gas distribution showerhead overlying the substrate support, one or more gas tubes introduce a source gas in a direction towards the substrate support, and one or more electron beam sources positioned on a first wall of the processing chamber. The electron beam sources can transfer one or more electron beams from the sources to a target on a wall opposite the first wall in a direction parallel to the substrate support.

FIG. 1 shows a schematic cross sectional view of a prior art embodiment of an electron beam chamber apparatus 100. As shown in FIG. 1, a substrate 125 can be placed in electron beam chamber apparatus 100 and positioned on a substrate support 130 that is disposed underneath a plasma generation source. A gas manifold 129 has an inlet that is fabricated in accordance with any one of a number of methods that are well known to those of ordinary skill in the art to provide a mechanism for admitting gas into vacuum chamber 120 at a particular input rate from a gas source 107. The chamber can be evacuated with a vacuum pump 135 that is connected to a leak valve 132. The vacuum pump 135 exhausts gas from the vacuum chamber 120 to control pressure inside vacuum chamber 120.

The electron source can be any source that works in such a vacuum environment. In some embodiments, the electron source generates one or more large area electron beams sufficiently wide to simultaneously expose the entire substrate. The electron source includes a cathode 122 and an anode 126 separated by an insulating member 128. The anode 126 is placed between the cathode 122 and the substrate 125, at a distance from the cathode that is less than the mean free path length of electrons emitted from the cathode. The potential between these two electrodes is generated by a high voltage power supply 139 applied to the cathode and a bias low voltage power supply 131 applied to the anode. The current can be varied over a wide range by varying the bias voltage applied to anode 126. The temperature of substrate 125 can be controlled during the electron beam treatment process by a heating apparatus (not shown) such as, for example, and without limitation, a resistive heater disposed within substrate or substrate support 130 in accordance with any one of a number of methods that are well known to those of ordinary skill in the art, or one or more infrared lamps disposed to irradiate substrate 125 in accordance with any one of a number of methods that are well known to those of ordinary skill in the art.

In operation of the electron beam chamber apparatus 100, the substrate to be exposed with the one or more electron beams is placed on the substrate support 130, and the vacuum chamber 120 is pumped from atmospheric pressure to a pressure in the range of 15-40 mTorr. The exact pressure is controlled via the variable rate leak valve 132, which is capable of controlling pressure to +/−1 mTorr. The high voltage at which the exposure is to take place is applied to the cathode 122 via the high voltage power supply 139. A bias low voltage power supply 131 (for example: a DC power supply capable of sourcing or sinking current) is also applied to the anode 126. The voltage on the anode is utilized to control electron emission from the cathode.

To initiate electron emission, the gas in the space between the cathode 122 and the substrate 125 must become ionized, producing positive ions and electrons. The anode 126 is placed at a distance less than the mean free path of the electrons emitted by the cathode 122. Therefore no significant ionization takes place in the accelerating field region 136 between the grid and the cathode. The ions created outside the anode are controlled (repelled or attracted) by the voltage applied to the anode 126. Thus, the emission (electron beam current) can be continuously controlled (from very small currents to very large currents) by varying the voltage on the grid. Alternatively, the electron emission can be controlled by means of the leak valve 132, which can raise or lower the number of molecules in the ionization region between the target and cathode.

The pressure in the gas manifold 129 may be controlled so as to vary the mean free path of the gas atoms and thus the energy delivered. Unlike the prior art electron beam chamber apparatus 100 shown in FIG. 1, the apparatus of the present invention controls the energy of one or more electron beams so that the amount of each type of active species may be controlled independently of the other typical process variables, such as process pressure.

Figure 6:
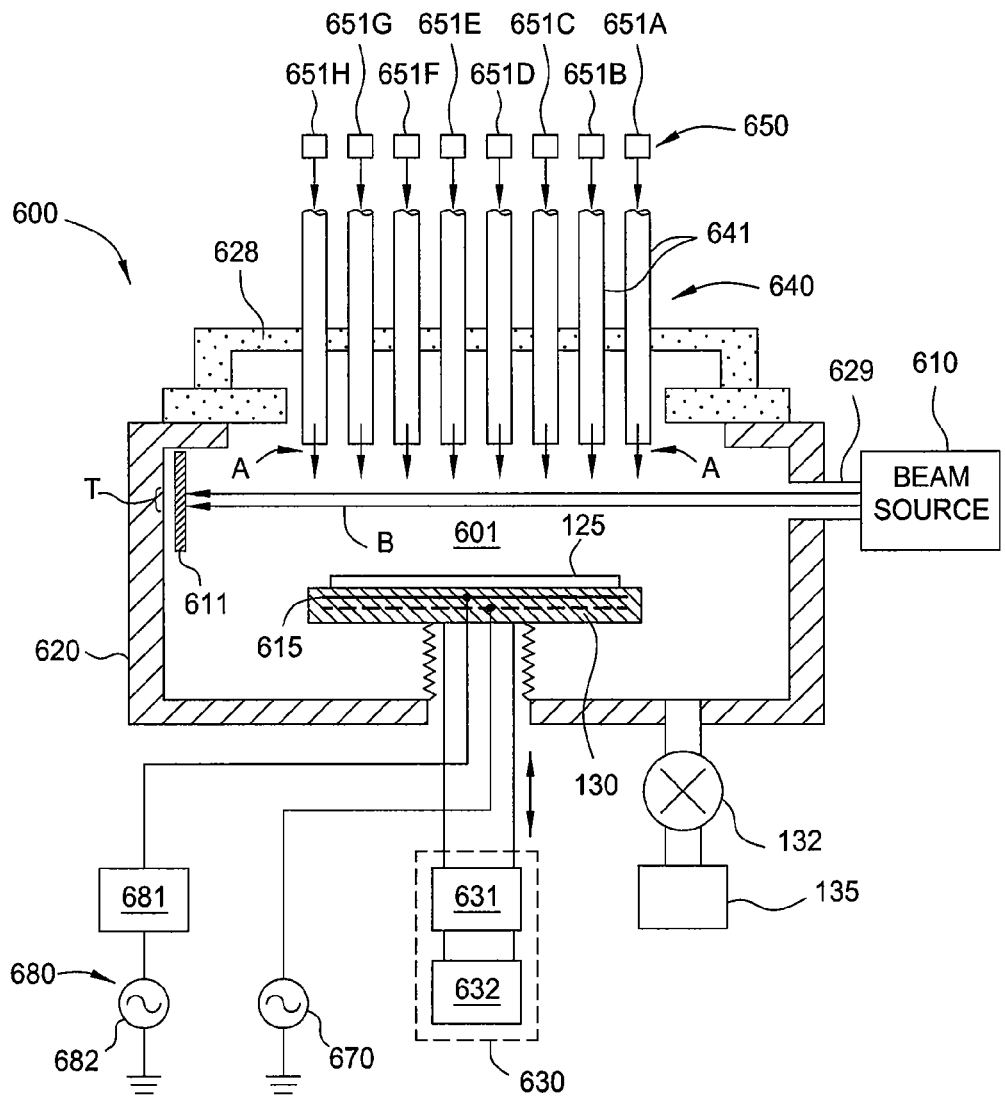
FIG. 6 shows a schematic cross sectional view of an electron beam apparatus of one embodiment described herein.

FIG. 6 shows an embodiment of an electron beam processing chamber in accordance with the invention. Generally, the electron beam processing chamber 600 includes one or more electron beams, shown here as an electron beam B, that is formed as a sheet (as opposed to a cylindrical beam). The electron beam B has a height T and a width W (see FIG. 7). In this case, the energy delivered in the electron beam is formed in the shape of a sheet, such that the cross-section of the beam has a width W larger than height T. Methods by which a high energy electron beam may be shaped into a thin sheet are described in U.S. Pat. No. 7,510,666. For example, in one method, a high voltage discharge may be struck between a long, hollow cathode and a slotted anode such that a portion of discharge current emerges through the slot into the processing chamber as an electron beam in the form of a sheet.

The electron beam B is emitted from a beam source 610 through a gas manifold 629 into a vacuum chamber 620. The electron beam B travels across the processing volume 601 of the vacuum chamber 620, in a direction parallel to a substrate support 130, towards an electrically conductive target 611. A gas assembly 650 introduces gases from gas sources (see 651A-651H) into the vacuum chamber 620. Although FIG. 6 shows eight gas sources, this embodiment is not limited to a particular number of gas sources. The gas source may be oxygen ($O_2$) gas, nitrogen ($N_2$) gas, or any precursor gas or a mixture of precursor gases. One or more impinging jets of gas A may enter the vacuum chamber 620 through an array of gas tubes 640. Each gas tube 641 introduces gas from a gas source into the chamber. The gas flows towards a substrate 125 supported by substrate support 130 inside the vacuum chamber 620. The substrate support 130 may be biased using a biased electrode 615 which may be coupled to an RF power source 680 comprising a power supply 682 and an RF impedance match network 681. The substrate support may also be heated using a heater 670 coupled to the substrate support 130. An actuator 630 coupled to the substrate support 130 may move the substrate support 130 up and down using a lift 632 and may rotate the substrate support 130 clockwise or counterclockwise using a rotation actuator 631.

Figure 7:
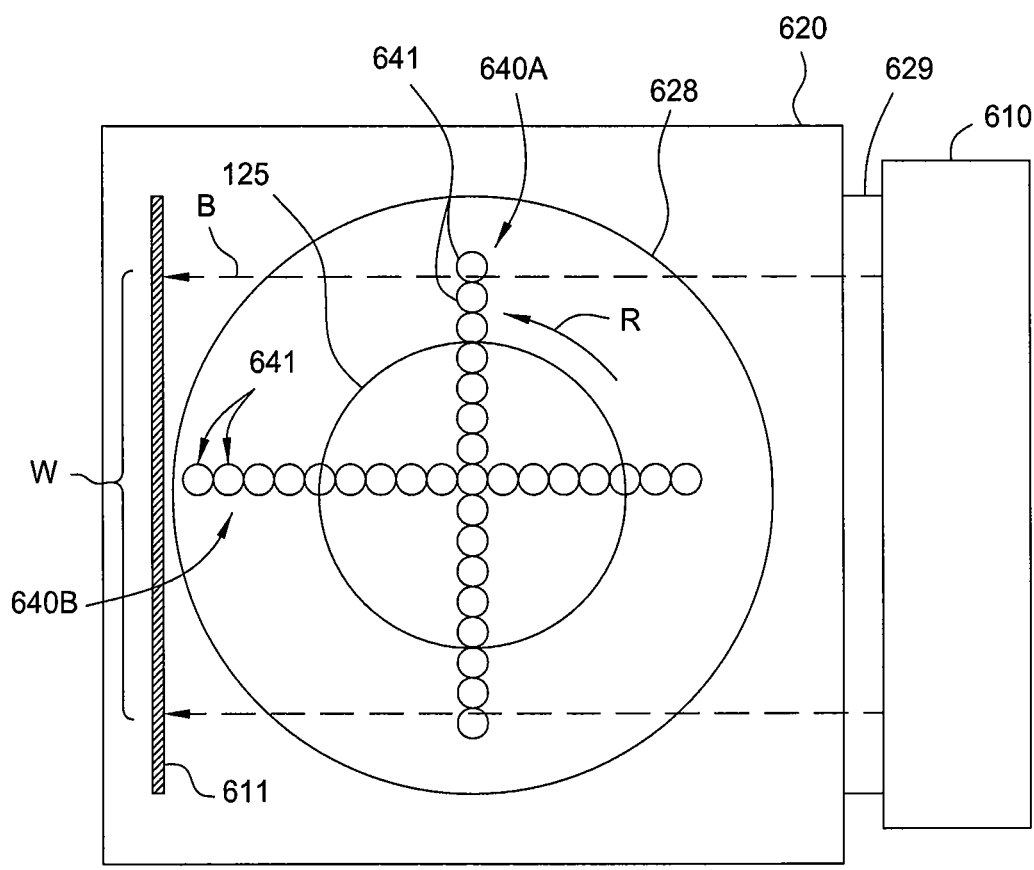
FIG. 7 shows a schematic cross sectional view of an electron beam apparatus of one embodiment described herein from a top perspective.

The electron beam B is aligned perpendicular to the gas stream directed towards a surface of the substrate 125. As shown in the embodiment in FIG. 6, multiple impinging jets of gas A of varying or constant gas composition may be delivered through the formed electron beam B to the surface of the substrate 125. In some configurations, the multiple impinging jets of gas A may be scanned across at least a portion of a moving substrate in order to increase throughput and improve substrate deposition process results. The substrate may translate or rotate under the impinging jets of gas A. FIG. 7 shows an embodiment of the electron beam processing chamber 600 from an overhead perspective. In the embodiment shown in FIG. 7, the substrate 125 may rotate in a direction of rotation R under a linear array 640A of impinging jets of gas and a linear array 640B of impinging jets of gas which may be perpendicular to the linear array 640A, both linear arrays being within the outline of showerhead 628. In this manner, a number of gas tubes 641 attached to the showerhead 628 can perform a uniform deposition as the substrate 125 rotates and having two linear arrays of gas tubes 641 increases throughput. In embodiments where the substrate does not rotate, the gas tubes 641 may be in any pattern in order to achieve uniform deposition over the substrate 125.

Figures 9A, 9B:
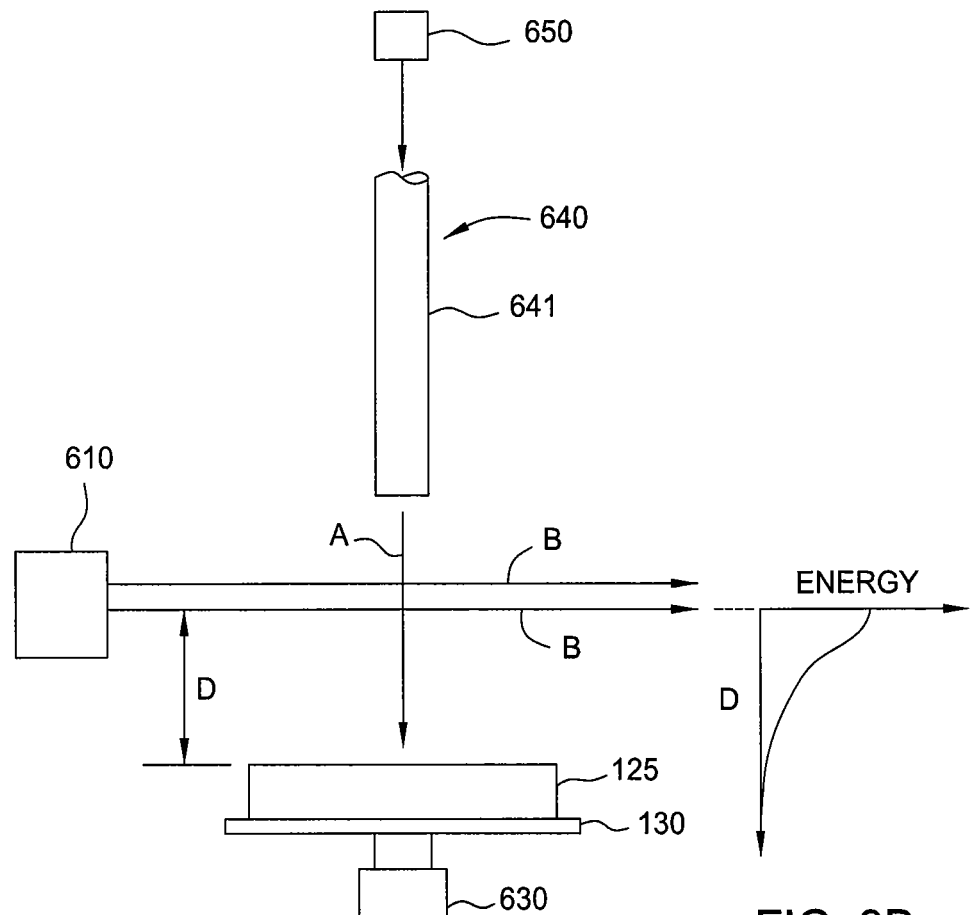
FIG. 9A shows a schematic cross sectional view of an electron beam apparatus of one embodiment described herein.
FIG. 9B shows a graph of electron energy versus distance from the substrate to the electron beam.

The distance from the electron beam B to the substrate 125 and the velocity of the gas through the electron beam may also be controlled in order to achieve better conformality. By flowing the gases perpendicular to the one or more electron beams, one can change the speed and the species of gas that arrive at the substrate. The spacing between the source and substrate, and the velocity of the gas are key to controlling the number of collisions. The velocity of gas affects the probability that electrons will hit gas atoms, thus changing the distribution and mean free path of the gas atoms. The higher the velocity of the gas, the further distance it travels for a given number of collisions. The number of collisions determines whether the gas atoms are neutralized. FIG. 9A shows a distance D between the electron beam B emitted from the beam source 610 and the substrate 125. FIG. 9B shows a graph of electron energy versus distance D. As shown in FIG. 9B, as the distance D increases, the energy of the electrons decreases. Therefore, the distance D between the electron beam B and the substrate 125 may be adjusted in order to control the gas species arriving at the substrate surface. The velocity of the impinging jet of gas A may be controlled by controlling the flow rate of the gas in the gas tube 641. In this manner, the energy of the gas species may be controlled by adjusting the velocity of the gas as it passes the electron beam B.

Deposition film quality may also be controlled by adjusting the temperature of the gas species as well as the temperature of the substrate. The substrate 125 may be heated by heating the substrate support 130 using heater 670. The gas coming out of the gas source 651A-651H may be heated in order to increase the energy of the gas atoms.

Figure 8:
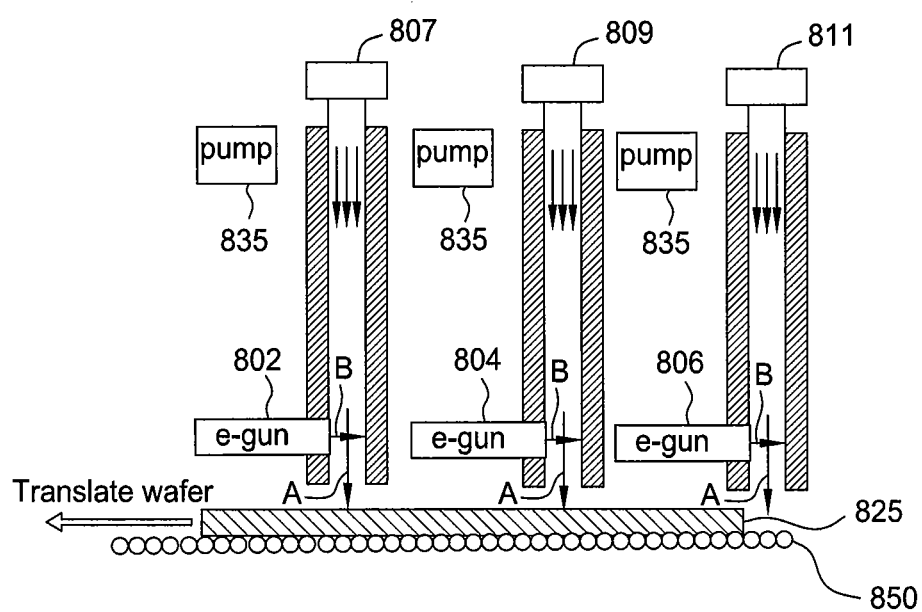
FIG. 8 shows a schematic cross sectional view of an electron beam apparatus of one embodiment described herein.

In another embodiment, gas flows from a gas source (807, 809 and 811) towards a substrate 825 that may be horizontally translated on rollers 850 or any other mechanism that can effectively horizontally move a substrate. Each gas conduit is coupled to an electron gun (802, 804, and 806) which emits an electron beam B which cuts across the stream of gas in a direction perpendicular to the gas stream, as shown in FIG. 8. In this embodiment, each electron beam B can be emitted at a different energy depending on the source gas. In order to increase throughput, the substrate 825 can be scanned across multiple impinging jets A, each jet pertaining to a different gas source, as shown in FIG. 8. Although only three gas sources are shown in FIG. 8, this embodiment is not limited to such. A pump 835 may be used in between separate deposition zones in order to create pressure differentials to ensure that source gas from one jet cannot enter another. The pumps help minimize gas contamination and improve process control.

The apparatus described above are scalable to the substrate size. It may not be necessary to change the beam power to deposit a film on a larger sized substrate (i.e., one may only need to increase the number of gas tubes over the substrate). The amount of energy, however, may change depending on the way the substrate is moved under the gas tubes. If translating the substrate (as shown in FIG. 8), 10-100 eV of energy may be applied. However, if the substrate is rotated during the deposition process, a higher energy may be applied, such as above 1000 eV, in order to have a more uniform deposition.

Methods for controlling the active species in one or more electron beams without having to change process conditions such as pressure or gas composition are also described herein. The methods tailor the formation of active species using one or more electron beams to improve gap-fill during an integrated circuit formation process.

Figure 2:
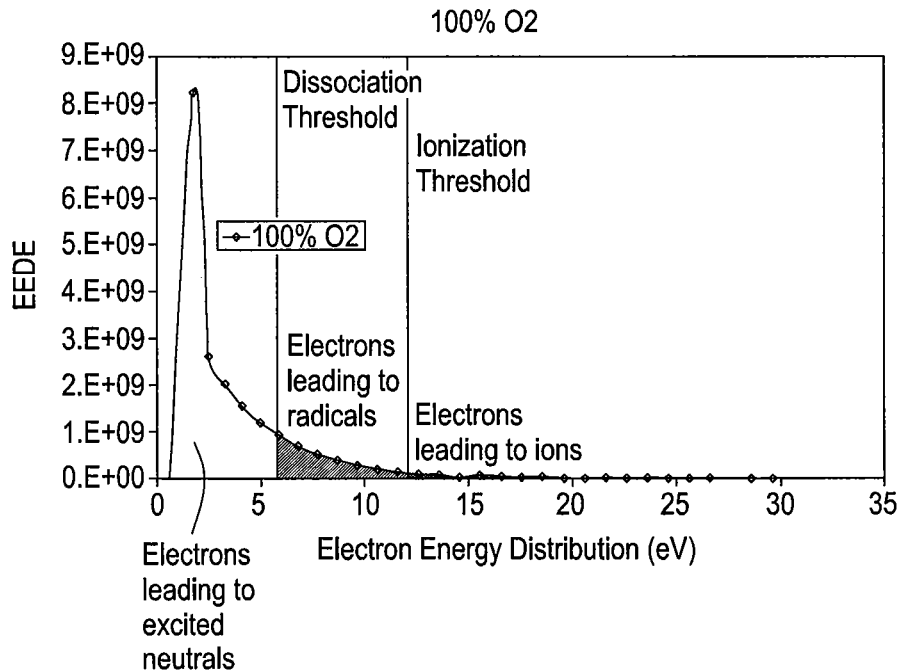
FIG. 2 is a graph showing the electron energy distribution for an inductive oxygen plasma.

FIG. 2 shows the electron energy distribution function (EEDF) for an inductively coupled oxygen plasma. In some processes, the desired species are the electrons that are capable of ionizing the gas. However, these are represented by the exponentially decaying end of the function (above about 12 eV) and amount to a small percentage of the plasma. In other processes, only radicals are desired, (i.e., no species at energies above 11 eV). However, because there will always an exponentially decaying tail, the electrons leading to radicals will always be created along with the electrons leading to ions. Currently, if only radicals are desired, a remote plasma source is used, and the electrons leading to ions are eliminated before reaching the actual substrate. By tailoring one or more electron beams, a high density plasma can be created by matching the electron energy with the gas collisional cross section. In the embodiments described herein, a low enough energy may be chosen so that only radicals, and no ions, are created.

Figure 3:
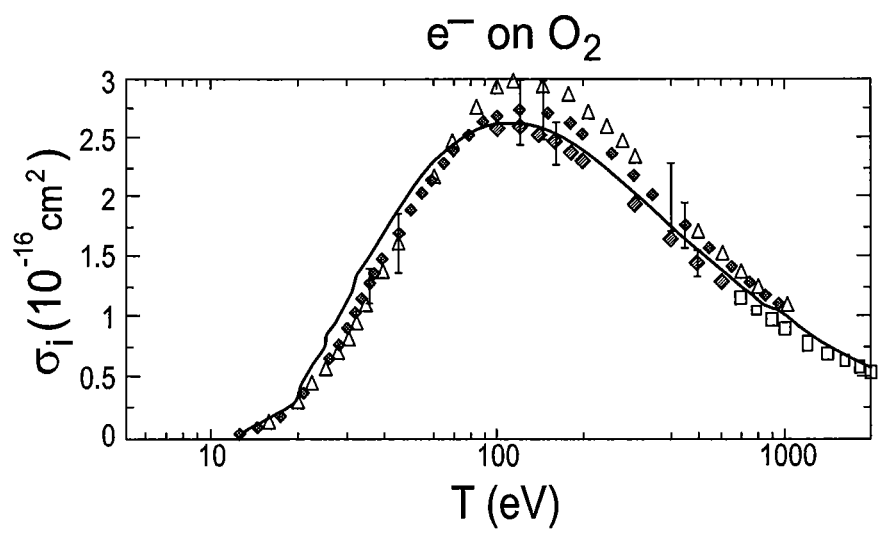
FIG. 3 is an ionization cross section of oxygen gas ($O_2$).

FIG. 3 shows the electron-impact cross section of oxygen gas. As can be seen, the maximum interaction occurs at an energy near 100 eV. This energy will lead to efficient ionization. Although the cross section is small for electron energies below ~12 eV, these low energy electrons can be used to produce dissociation without ionization.

Figure 4:
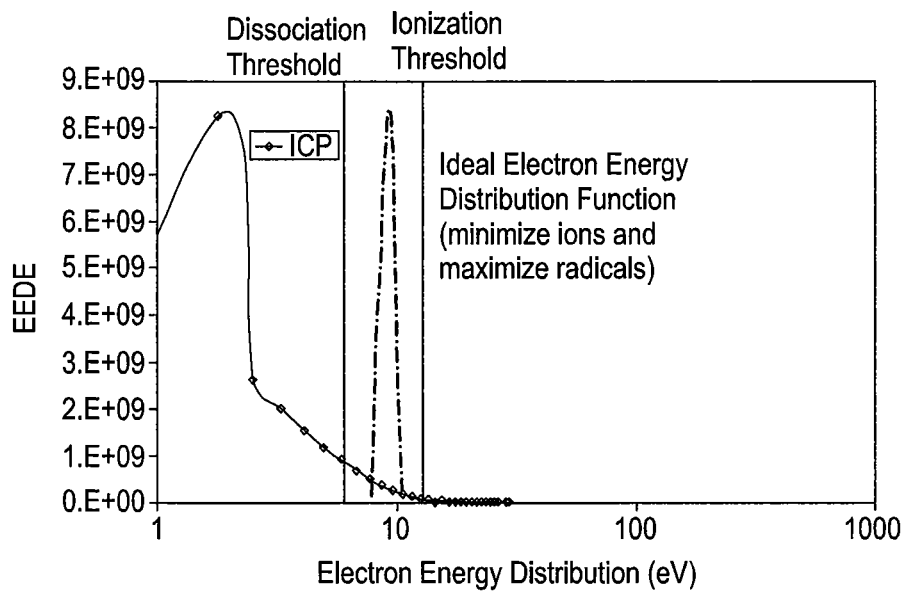
FIG. 4 is a graph showing the electron energy distribution for an inductive oxygen plasma with an electron beam tailored to maximize radicals.
Figure 5:
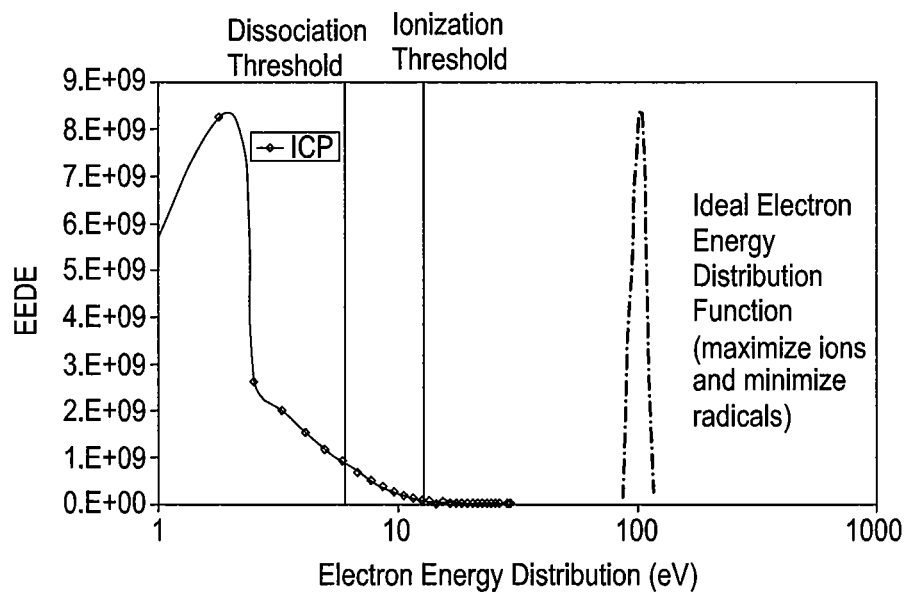
FIG. 5 is a graph showing the electron energy distribution for an inductive oxygen plasma with an electron beam tailored to maximize ions.

FIGS. 4 and 5 show how the radical to ion ratio can be drastically changed without changing any process conditions (e.g., pressure or gas chemistry). FIG. 4 is a graph showing the electron energy distribution for an inductively coupled oxygen ($O_2$) plasma with one or more electron beams tailored to maximize radicals. The ideal energy distribution function for minimizing ions and maximizing radicals is shown by the dashed/dotted line. The energy level at which ions are minimized and radicals are maximized is called the dissociation peak. Therefore, the one or more electron beams tailored to maximize radicals for an oxygen plasma should be kept at an energy level of around 10 eV or less, between the dissociation threshold and the ionization threshold. The energy would be higher for nitrogen gas ($N_2$) because it has a triple bond ($O_2$ has a double bond). The ionization threshold will always be higher than the dissociation threshold, so one can choose an electron energy to create radicals and not ions. The electron energy will depend on the gas used.

When the one or more electron beams are operated so that only radicals are created, the substrate should not be biased. The temperature of the substrate is also important. Because radicals tend to have lower energy than ions, they need additional energy in order to form a film. Therefore, the substrate should be maintained at a high temperature, such as 500-1200° C. A high substrate temperature also assists the diffusion of radicals into the substrate. For example, in the case of growing a $SiO_2$ film, oxygen radicals must diffuse through already existing oxide down to the interface with the silicon. The higher temperature facilitates diffusion of the radicals. In the case of formation of a gate oxide, a high temperature will yield a high electrical quality oxide and better conformality for surface features.

FIG. 5 is a graph showing the electron energy distribution for an inductively coupled oxygen plasma. FIG. 5 shows the ideal electron energy distribution function for maximizing ions and minimizing radicals, which for oxygen is at about 100 eV (shown by the dashed/dotted line), much higher than the ionization threshold. Therefore, the one or more electron beams should be maintained in the range of energy level shown by the dashed/dotted line in FIG. 5 in order to maximize ions. The energy level at which radicals are minimized and ions are maximized is called the ionization peak. Ions are desired for high aspect ratio feature fill because they are accelerated towards the substrate surface in the normal direction. The ionized species will deposit primarily on the horizontal surfaces if the sidewalls are perfectly vertical, where primarily in this context means more deposition on horizontal surfaces than on non-horizontal surfaces. Radicals, on the other hand, tend to favor the sidewalls instead of the bottom of a feature. Radicals, such as an oxygen radical, have no charge so the directionality of the radical species depends on the pressure, since collisions scatter the radical as it approaches the structure. This can cause the top corner of a feature to continue to grow and pinch, creating an air gap. Therefore, by maximizing ions and minimizing radicals, one can carry out a true bottom up fill. While FIG. 5 shows the energy distribution function for oxygen, the concept of maximizing ions is not limited to oxygen, and applies to the deposition of any precursor gas in a high aspect feature.

In one embodiment, the ionization energy and the dissociation energy can be controlled so as to ensure general proportions of ions and radicals from the source gas. Ionized species are generally understood to deposit in the direction of movement (bottom up) and radicals are generally understood to deposit based on collision and pressure in the chamber (on the sidewalls of a feature). As such, a conformal deposition of the source gas can be reached by determining the side fill rate for the radicals of a particular source gas, determining the bottom fill rate from the ions of the same source gas and creating an ion to radical ratio which allows for similar rates of deposition on both the sidewall and the bottom of a feature. Alternatively, it is contemplated that the ion to radical ratio can be varied through the deposition process, so as to alternate between periods of bottom up deposition and sidewall deposition, in order to obtain the desired deposition profile.

While conventional processes do not easily control whether bottom-up or side wall preferential deposition is occurring, the methods described herein may be used to adjust the composition of radicals and/or ions during the different phases of the deposition process in order to control bottom-up fill at one phase and then complete fill at another phase or combine the processes. This method advantageously allows use of just one tool to accomplish the different phases (bottom-up or side wall) of deposition.

While the foregoing is directed to embodiments of the present invention, other and further embodiments of the invention may be devised without departing from the basic scope thereof, and the scope thereof is determined by the claims that follow.

The invention claimed is:

1. A method of controlling an active species of one or more electron beams, said method sequentially comprising:
   positioning a substrate in a processing chamber;
   flowing the one or more source gases into the processing chamber, wherein the source gas has an ionization threshold energy level and a dissociation threshold energy level;
   impinging the source gases with one or more electron beams at a first energy level, which is above the ionization threshold energy level of the source gas, to deposit a first layer of a desired thickness primarily on horizontal surfaces of the substrate;
   maintaining the flow of the one or more source gases into the processing chamber; and
   impinging the source gases with one or more electron beams at a second energy level, which is below the ionization threshold energy level and above the dissociation threshold energy level of the source gases, to favor depositing a second layer of a desired thickness on the substrate.

2. The method of claim 1, wherein the one or more electron beams impinge the source gases at an angle between 75° and 105°.

3. The method of claim 1, wherein the one or more source gases are heated prior to introduction into the chamber.

4. The method of claim 1, further comprising maintaining the substrate from about 500° C. to about 1200° C. after the bottom-up thickness is achieved.

5. The method of claim 1, wherein the energy level of the one or more electron beams is maintained at a level from about the midpoint between the dissociation threshold energy level and the ionization threshold energy level and about the dissociation threshold energy level after the bottom-up thickness is achieved.

6. The method of claim 1, wherein the substrate is biased.

7. The method of claim 6, wherein the substrate is not biased after the bottom-up thickness is achieved.

8. The method of claim 1, wherein each source gas is impinged separately by the one or more electron beams.

9. The method of claim 1, wherein the first layer and second layers are conformal.

* * * * *